United States Patent [19]

Motoyoshi et al.

[11] Patent Number: 5,373,178
[45] Date of Patent: Dec. 13, 1994

[54] MOSFET WITH SIDEWALL SPACER ON GATE SECTION

[75] Inventors: Makoto Motoyoshi, Sagamihara; Eita Kinoshita, Chiba, both of Japan

[73] Assignee: Kawasaki Steel Corporation, Kobe, Japan

[21] Appl. No.: 95,540

[22] Filed: Jul. 26, 1993

[30] Foreign Application Priority Data

Jul. 29, 1992 [JP] Japan .................................. 4-202618
Jul. 15, 1993 [JP] Japan .................................. 5-175400

[51] Int. Cl.⁵ .......................................... H01L 29/78
[52] U.S. Cl. .................................. 257/344; 257/346; 257/408; 257/900
[58] Field of Search ................ 257/344, 408, 900, 346

[56] References Cited

U.S. PATENT DOCUMENTS

| | | | |
|---|---|---|---|
| 4,786,609 | 11/1988 | Chen | 257/900 |
| 4,835,112 | 5/1989 | Pfiester et al. | 257/900 |
| 4,908,326 | 3/1990 | Ma et al. | 257/408 |
| 4,971,922 | 11/1990 | Watabe et al. | 257/408 |
| 5,023,679 | 6/1991 | Shibata | 257/344 |
| 5,091,763 | 2/1992 | Sanchez | 257/900 |
| 5,132,758 | 7/1992 | Minami et al. | 257/344 |
| 5,182,619 | 1/1993 | Pfiester | 257/900 |
| 5,254,867 | 10/1993 | Fukuda et al. | 257/346 |

OTHER PUBLICATIONS

Mizuno et al. "Si3N4/SIO2 Spacer Induced High Reliability in LDDMOSFET and Its Simple Degradation Model", IEEE International Electron Devices Meeting (Dec. 1988), Digest pp. 234–237.

Seiki Ogura et al., "IEEE Transactions on Electron Devices", Design and Characteristics of the Lightly Doped Drain–Source (LDD) Insulated Gate Field-Effect Transistor, vol. ED-27, No. 8, Aug., 1980, pp. 1359–1367.

T. Mizuno et al., "IEDM Technical Digest", High Dielectric LDD Spacer Technology for High Performance MOSFET Using Gate-Fringing Field Effects, 1989, pp. 26.1.1–26.1.4.

Primary Examiner—Gene M. Munson
Attorney, Agent, or Firm—Oliff & Berridge

[57] ABSTRACT

After forming a low concentration impurity layer by ion implanting an impurity into a semiconductor substrate 1 by using a gate electrode 7 on the semiconductor substrate 1 as a mask, side walls composed of films having a large etching resistivity with respect to an interlayer dielectric film 13 are formed on side surfaces of the gate electrode 7 and a gate oxide film 6 located beneath the gate electrode 7. Subsequently, the interlayer dielectric film 13 is formed over the whole surface, and a contact hole 18 having a part of side walls constituted by the first-mentioned side walls 8 and a field oxide film 2 is formed. A high concentration impurity layer is formed by implanting an impurity through the contact hole 18.

4 Claims, 5 Drawing Sheets 0.5 μm

MOSFET WITH SIDEWALL SPACER ON GATE SECTION

BACKGROUND OF THE INVENTION

1. Field of the Invention

The present invention relates to a semiconductor device and a method for manufacturing the same, and in particular, to a fine MIS (Metal Insulator Semiconductor) type semiconductor device represented by a MOS (Metal Oxide Semiconductor) transistor, and a method for manufacturing the same.

2. Description of the Prior Art

Heretofore, with the progress in higher integration and higher operating speed of LSIs, MOS transistors have been rapidly made finer. In such a fine semiconductor device, since a gate length is very short, problems have been posed in which a breakdown voltage between a source and a drain is reduced, a threshold voltage is reduced, and a hot carrier resistant-property is reduced. In order to solve these problems, various approaches have been proposed.

As an example, S. Ogura et al. disclose in "IEEE Transactions Electron Devices", ED-16, page 1356, issued in 1980, an LDD (Lightly Doped Drain) type MOS transistor structure in which a source and a drain respectively composed of a low concentration impurity layer and a high concentration impurity layer are formed by reducing an impurity concentration (a low concentration impurity layer is formed) in the vicinity of a gate. This LDD type MOS transistor structure provides an advantage in that the low concentration impurity layer moderates an electric field in the vicinity of the gate, in the source and in the drain, and in that the reduction of a breakdown voltage between the source and the drain, the reduction of a threshold voltage, and the generation of hot carrier are prevented. In this LDD type MOS transistor structure, normally, the low concentration impurity layer is formed in a self-aligned manner by ion implanting of an impurity into a semiconductor substrate by using a gate electrode formed on the semiconductor substrate as a mask, side walls are formed on side surfaces of the gate electrode after the low concentration impurity layer is formed, and the high concentration impurity layer is formed in the self-aligned manner by implanting an impurity into the semiconductor substrate by using the side walls and the gate electrode as a mask.

Furthermore, T. Mizuno et al. disclose in "IEDM Technical Digest", page 613, issued in 1989, that when a material having a higher dielectric constant is used, as side walls which are utilized for forming the low concentration impurity layer and the high concentration impurity layer, the electric field at a gate fringe portion is increased, and the electric field at a drain end is moderated, and as a result, the breakdown voltage between the source and the drain is improved.

However, in the above-mentioned LDD type MOS type transistor structure, a plurality of thermal processes including a thermal process of forming an interlayer dielectric film at a high temperature, and a thermal process of performing reflow of a glass film or the like are need after the low concentration impurity layer and the high concentration impurity layer are formed. As a result, although the LDD type MOS type transistor is structured to prevent the reduction of the breakdown voltage between the source and the drain, the reduction of the threshold voltage and the generation of the hot carrier, a problem arises in which during the thermal processes, the impurities of the low and the high impurity concentration layers are diffused, and an effective channel length is shortened, and the short channel effect appears significantly to the extent that the above-mentioned advantages are diminished.

SUMMARY OF THE INVENTION

The present invention solves the above-mentioned problems, and it is an object to provide a semiconductor device and a method for manufacturing the same which suppresses the short channel effect and which is improved in a high speed operation and a fine structure.

In a first aspect of the present invention, a semiconductor device comprises a gate electrode formed on a gate oxide film on a semiconductor substrate, a source and a drain respectively composed of a low concentration impurity layer and a high concentration impurity layer, side walls formed on side surfaces of a gate section including the gate electrode and the gate oxide film, an interlayer dielectric film formed on the semiconductor substrate, the gate electrode, and the side walls, and contact holes opened into the interlayer dielectric film for respectively connecting the source and the drain, wherein the side walls are formed with films having a property in which an etching resistivity with respect to the interlayer dielectric film is large and the side walls of the gate section constitute at least a part of side wall of each of the contact holes, and the high impurity concentration layer is formed in the semiconductor substrate with respect to corresponding one of the contact holes in a self-aligned manner.

In a second aspect of the invention, at least a part of the side walls of each of the contact holes is composed of a field oxide film.

In a third aspect of the invention, the side walls of the gate section are composed of silicon nitride films.

In a fourth aspect of the invention, the side walls of the gate section are composed of polycrystalline silicon films.

In a fifth aspect of the invention, a method for manufacturing a semiconductor device comprises a first step of forming a gate electrode on a gate oxide film on a semiconductor substrate, a second step of forming a low concentration impurity layer by ion implanting into the semiconductor substrate by using the gate electrode as a mask, a third step of forming side walls on side surfaces of a gate section including the gate electrode and the gate oxide film after the ion implanting, the side walls being composed of films of a property having a large etching resistivity with respect to an interlayer dielectric film, a fourth step of forming the interlayer dielectric film over a whole surface of the semiconductor substrate, the gate electrode, and the side walls, a fifth step of opening a contact hole into the interlayer dielectric film, at least a part of side wall of the contact hole being constituted by the side walls of the gate section, a sixth step of forming a high concentration impurity layer by ion implanting by using the interlayer dielectric film having the contact hole formed therein and the side walls of the gate section as a mask, and a seventh step of performing a thermal treatment of the semiconductor substrate having the high concentration impurity layer formed therein.

In a sixth aspect of the invention, a method manufacturing a semiconductor device comprises a first step of forming a gate electrode on a gate oxide film on a semiconductor substrate, a second step of forming a low concentration impurity layer by ion implanting into the semiconductor substrate by using the gate electrode as a mask, a third step of forming side walls of films having a large etching resistivity with respect to an interlayer film on side surfaces of a gate section including the gate electrode and the gate oxide film after the ion implantation, a fourth step of forming the interlayer dielectric film over a whole surface after forming the side walls, a fifth step of opening a contact hole into the interlayer insulating film, at least a part of side walls of the contact hole being constituted by the side walls of the gate section and constituted by a field oxide film, a sixth step of forming a high concentration impurity layer by ion implanting by using, as a mask, the interlayer insulating film having the contact hole formed therein, and the side walls of the gate section, and the field oxide film, and a seventh step of performing a thermal treatment of the semiconductor substrate having the high concentration impurity layer.

In a seventh aspect of the invention, a method for manufacturing a semiconductor device comprises a first step of forming a gate electrode on a gate oxide film on a semiconductor substrate, a second step of forming an oxide film on a surface of the gate electrode, a third step of forming a low impurity concentration layer by ion implanting into the semiconductor substrate by using the gate electrode having the oxide film formed thereon as a mask, a fourth step of forming, after the ion implantation, side walls composed of polycrystalline silicon films on side surfaces of the oxide film formed on side surfaces of the gate electrode and the gate oxide film, a fifth step of forming an interlayer dielectric film over a whole surface, a sixth step of forming a contact hole in the interlayer dielectric film, at least a part of side walls of the contact hole being constituted by the side walls composed of the polycrystalline silicon films, a seventh step of forming a high concentration impurity layer by ion implanting by using, as a mask, the interlayer dielectric film having the contact hole formed therein and the side walls of the contact hole, and a eighth step of performing a thermal treatment of the semiconductor substrate having the high concentration impurity layer formed therein.

In an eighth aspect of the invention, a method for manufacturing a semiconductor device comprises a first step of forming a gate electrode on a gate oxide film on a semiconductor substrate, a second step of forming an oxide film on a surface of the gate electrode, a third step of forming a low concentration impurity layer by ion implanting into the semiconductor substrate by using the gate electrode having the oxide film formed thereon as a mask, a fourth step of forming, after the ion implantation, side walls composed of polycrystalline silicon films on side surfaces of the oxide film formed on side surfaces of the gate electrode, and the gate oxide film, a fifth step of forming an interlayer dielectric film over a whole surface after the side walls have been formed, a sixth step of forming a contact hole in the interlayer dielectric film, at least a part of side walls of the contact hole being constituted by a field oxide film and the side walls composed of polycrystalline silicon films, a seventh step of forming a high concentration impurity layer by ion implanting by using the interlayer dielectric layer having the contact hole formed therein, the side walls composed of polycrystalline silicon films and the field oxide film as a mask, and a eighth step of performing a thermal treatment of the semiconductor substrate having the high concentration impurity layer formed therein.

In the semiconductor device in the first aspect of the present invention, the side walls of the gate section including the gate electrode and the gate oxide film are composed of the films having the property in which etching resistivity with respect to the interlayer dielectric film is large, and these side walls form at least a part of the side walls of the contact hole, and the high concentration impurity layer is formed by self alignment with respect to the contact hole. As a result, a spacing between the gate electrode and the contact hole can be reduced, that is, areas of the source and the drain can be reduced. Thus, a plane size of the semiconductor device can be made small. Furthermore, since a junction area between the source and the well and a junction area between the drain and the well can be made small, a junction capacitance between the source and the well and a junction capacitance between the drain and the well can be reduced.

Furthermore, since a metallic wiring layer connected to the source and the drain is formed extending to an end portion of the side walls of the gate section, a parasitic resistance of the source and the drain diffusion layer is reduced. Accordingly, a high speed operation of the device can be achieved, and the non-uniformity of characteristics of the device can be suppressed.

Furthermore, since the semiconductor device of the first aspect of the invention is provided with an LDD structure, in addition to the above-mentioned advantage, there is no disturbance in improving a hot carrier-resistant property.

In the semiconductor device in the second aspect of the invention, since at least a part of the side walls of the contact hole is constituted by the side walls of the gate section, and constituted by the field oxide film, in addition to the above-mentioned advantage, a spacing between the gate electrode and the field oxide film, that is, areas of the high concentration impurity layers of the source and the drain can be further reduced.

Furthermore, in the semiconductor device in the third aspect of the invention, since the side walls of the gate section are composed of the silicon nitride films, in addition to the above-mentioned advantage, an electric field at a drain end can be moderated. As a result, the generation of hot carriers is suppressed, and the hot carrier-resistant property can be improved. Specifically, the silicon nitride film is of the property having a very large etching resistivity with respect to the interlayer dielectric film, and at the same time, the silicon nitride film has a dielectric property. Accordingly, when the side walls of the gate section are formed by the silicon nitride films, the formation of the contact hole is easy, and at the same time, the insulation between the contact hole and the gate electrode can be sufficiently maintained.

In the semiconductor device in the fourth aspect of the invention, since the side walls of the gate section are composed of the polycrystalline silicon films, in addition to the above-mentioned advantage, the breakdown voltage between the source and the drain is improved.

Specifically, the polycrystalline silicon film has a very large etching resistivity with respect to the interlayer dielectric film, and at the same time, the dielectric constant is very high. Accordingly, the formation of the contact hole is very easy, and the breakdown voltage between the source and the drain is improved. In this case, in order to sufficiently maintain the insulation between the contact hole and the gate electrode, it is preferable to cover a surface of the gate electrode by an oxide film.

Furthermore, in the manufacturing method of the semiconductor device of the fifth aspect of the invention, the side walls constituted by the films having a large etching resistivity with respect to the interlayer dielectric film are formed on the side surfaces of the gate electrode and the gate oxide film after the formation of the low concentration impurity layer. Thereafter, the contact hole is formed in the interlayer dielectric film which has been formed over the whole surface (the semiconductor substrate, the gate electrode and the side walls) so that at least a part of the side walls of the contact hole is constituted by the side walls of the gate section. Accordingly, at the time of forming the contact hole, the side walls of the gate section are hardly eroded, and a spacing between the gate electrode and the contact hole, that is, areas of the source and the drain can be made small. Accordingly, it is possible to reduce junction areas respectively between the source and the well and between the drain and the well. As a result, it is possible to reduce junction capacitance respectively between the source and the well and between the drain and the well.

Furthermore, since a metallic wiring layer connected to the source and the drain is formed extending to an end portion of the side walls of the gate section, a parasitic resistance of the source and the drain diffusion layer can be reduced. Thus, a high speed operation of the device is achieved, and at the same time, the non-uniformity of the device characteristics can be suppressed.

Moreover, since the high concentration impurity layer is formed by the ion implantation by using the interlayer dielectric film which has the contact hole formed therein and the side walls as a mask, it is possible to form this by self alignment. Accordingly, the spacing between the gate electrode and the contact hole can be reduced regardless of the accuracy of the alignment by a photolithographic apparatus. Furthermore, since the contact ion implantation to reduce a contact resistance can be performed simultaneously with the formation of the high concentration impurity layer, the process can be made simple.

Furthermore, since the high concentration impurity layer is only subjected to a thermal treatment for activating the impurity layer in a later process, it is possible to limit the diffusion of the impurity to a minimum extent, and the short channel effect can be suppressed.

In the method for manufacturing the semiconductor device in the sixth aspect of the invention, since the contact hole is opened in the interlayer dielectric film so that at least a part of side walls of the contact hole is constituted by the side walls of the gate section and constituted by the field oxide film, the spacing between the gate electrode and the field oxide film, thai is, the high concentration impurity layer can be further reduced.

Here, the field oxide film is a film formed by thermal oxidation, and as compared with the interlayer dielectric film formed by the CVD method, the etching resistivity is high. Accordingly, the field oxide film is hardly eroded at the time of opening the contact hole.

In the method for manufacturing the semiconductor device in the seventh aspect of the invention, after the oxide film is formed on the surface of the gate electrode, side walls composed of polycrystalline silicon films are formed on the oxide films, that is, areas of the source and the drain are reduced. Furthermore, junction areas respectively between the source and the well and between the drain and the well are reduced, and junction capacitance respectively between the source and the well and between the drain and the well are reduced. Thus, higher integration is achieved.

Also, since the oxide film is formed on the surface of the gate electrode, insulation between the contact hole and the gate electrode can be sufficiently maintained.

In the method of manufacturing method of the semiconductor device in the eighth aspect of the invention, since the contact hole is opened into the interlayer dielectric film so that at least a part of the side walls thereof is formed by the side walls of the gate section and the field oxide film, the spacing between the gate electrode and the field oxide film, that is, areas of the high concentration impurity layers of the source and the drain are further reduced.

Also, since the oxide film is formed on the surface of the gate electrode, insulation between the contact hole and the gate electrode can be sufficiently maintained.

DESCRIPTION OF THE PREFERRED EMBODIMENTS

Figure 1:
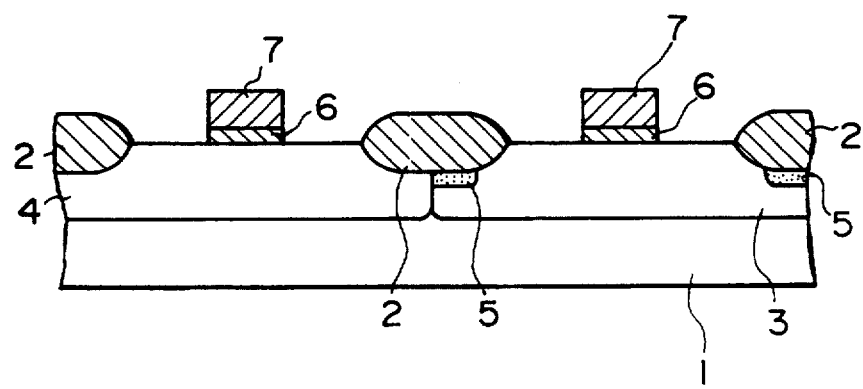
FIG. 1 is a partial sectional view showing a part of a manufacturing process of a semiconductor device in a first embodiment of the present invention.

A first embodiment of the present invention will be described with reference to FIGS. 1 to 5.

In a process shown in FIG. 1, after forming an N well 4 and a P well 3 in a P-type semiconductor substrate 1, a field oxide film 2 having a film thickness of about 600 nm is formed by a selective oxidizing technique on a device separation area of the semiconductor substrate 1, and a channel stop implanted layer 5 is formed in an area of the P well 3 just below the field oxide film 2 by a prior art method.

Subsequently, after forming an oxide film having a film thickness of about 11 nm on the whole surface of the semiconductor substrate 1 by thermal oxidation, boron for adjusting a threshold voltage is ion implanted. Then, a polycrystalline silicon film having a film thickness of about 350 nm is deposited on the oxide film at a temperature of about 620° C. by a CVD (Chemical Vapor Deposition) method. Following this, phosphorous is doped into the polycrystalline silicon film so as to reduce a resistance of the polycrystalline silicon film. At this time, POCl₃ is used as a source gas.

The polycrystalline silicon film and the oxide film are patterned, and a gate oxide film 6 and a gate electrode 7 are formed on a desired position in a device area of the semiconductor substrate 1.

In this manner, an N-type MOS transistor section is formed in the area of the P well 3, and a P-type MOS transistor section is formed in the area of the N well 4 of the semiconductor substrate 1.

Figure 2:
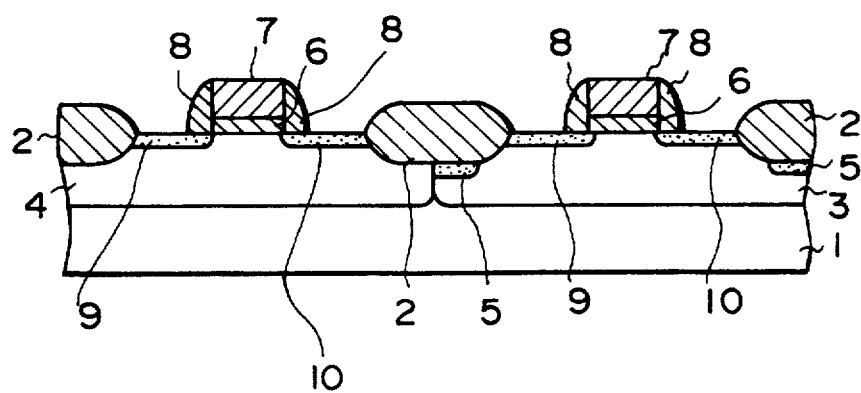
FIG. 2 is a partial sectional view showing a part of the manufacturing process of the semiconductor device in the first embodiment of the present invention.

In a process shown in FIG. 2, by using the gate electrode 7 obtained in the process shown in FIG. 1 as a mask and phosphorous of a relatively low concentration is ion implanted into the N-type MOS transistor section, and similarly, boron of a relatively low concentration is ion implanted into the P-type MOS transistor section, and a source region 9 of a relatively low impurity concentration and a drain region 10 of a relatively low impurity concentration are formed.

Subsequently, after depositing a silicon nitride film having a film thickness of about 150 nm on the gate electrode 7 and the semiconductor substrate 1 by the CVD method at a temperature of about 760° C., the silicon nitride film is subjected to anisotropic etching thereby to form side walls 8 composed of silicon nitride films on side surfaces of a gate section including the gate electrode 7 and the gate oxide film 6.

Figure 3:
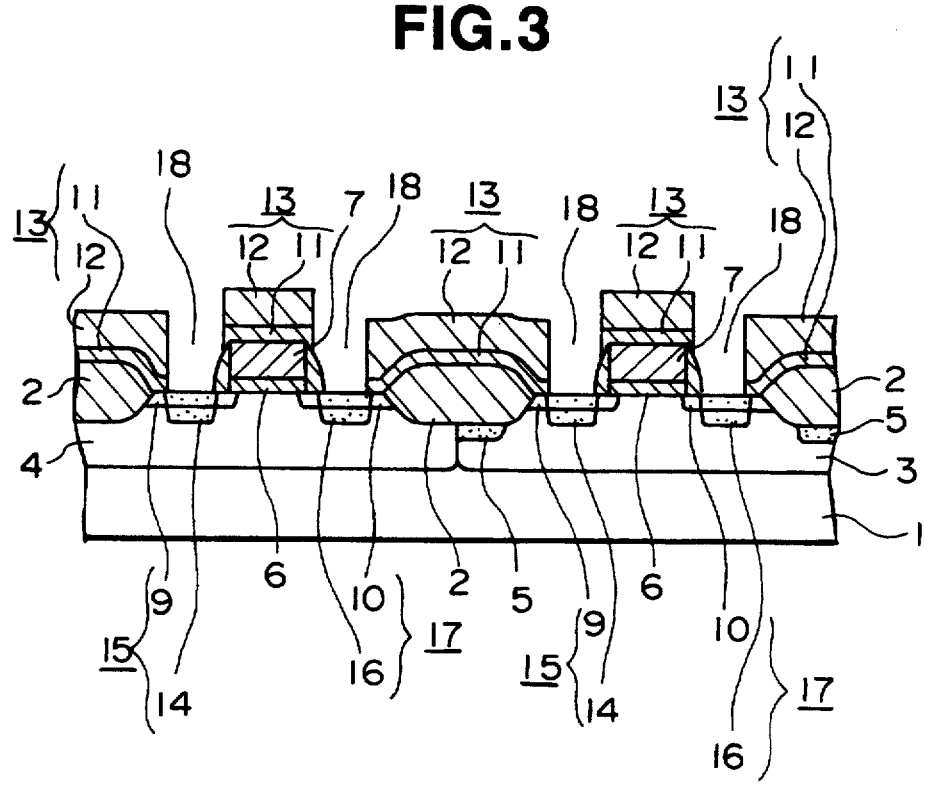
FIG. 3 is a partial sectional view showing a part of the manufacturing process of the semiconductor device in the first embodiment of the present invention.

In a process shown in FIG. 3, a silicon oxide film 11 having a film thickness of about 100 nm is deposited on the semiconductor substrate 1, on the gate electrode 7 and the side walls 8 obtained in the process shown in FIG. 2 by the CVD method at a temperature of about 430° C.

Subsequently, after forming a boron phosphorous glass (BPSG) film 12 having a film thickness of about 300 nm on the silicon oxide film 11 by the CVD method at a temperature of about 430° C., the boron phosphorous glass is made to reflow by subjecting to a thermal treatment for 30 minutes in a nitrogen atmosphere at a temperature of 900° C.

In this manner, an interlayer dielectric film 13 composed of the silicon oxide film 11 and the boron phosphorous glass film 12 is formed.

Subsequently, a photoresist film is coated on the interlayer dielectric film 13, and by patterning this photoresist film, a mask which is used for opening a contact hole 18 in a later process is formed. At this time, the photoresist film is patterned so that a part of side walls of the contact hole 18 is constituted by the side walls 8 of the gate section (or a part of the contact hole 18 is defined by the side walls 8).

Thereafter, the interlayer dielectric film 13 is subjected to the anisotropical etching to open the contact hole 18 by using the patterned photoresist film as a mask. In this case, since the side walls 8 are composed of the silicon nitride film having a very large ething resistivity with respet to the interlayer dielectric film 13, the side walls 8 are hardly eroded in the anisotropical etching. Accordingly, at least a part of the side walls of the contact hole 18 can be formed by the side walls 8 of the gate section. By virtue of this, the spacing between the gate electrode 7 and the contact hole 18, can be made small, and the device can be made finer.

Subsequently, phosphorous having a relatively high concentration is ion implanted into the N-type MOS transistor section, and similarly, boron having a relatively high concentration is ion implanted into the P-type MOS transistor section by using the photoresist film after it is patterned as a mask, and a source region 14 of a relatively high impurity concentration and a drain region 16 of a relatively high impurity concentration are formed. In this manner, since the contact hole 18 is also used as an aperture of the mask at the time of forming the source region 14 and the drain region 16 of a relatively high impurity concentration, the process can be made simple.

Thereafter, the semiconductor substrate 1 is subjected to a thermal treatment for 15 minutes in a nitrogen atmosphere at a temperature of 850° C., and the impurities which have been implanted into the source region and the drain region are activated.

In this manner, a source 15 composed of the source region 9 and the source region 14, and a drain 17 composed of the drain region 10 and the drain region 16 are formed in a self-aligned manner.

Since the source 15 and the drain 17 formed in the above-mentioned process are subjected to only the thermal treatment for activating the impurities, the diffusion of the impurities can be suppressed to a minimum extent, and it is possible to suppress the short channel effect. Furthermore, since the areas of the source 15 and the drain 17 are reduced, it is possible to reduce junction capacitance at these portions. Thus, a high speed operation of the device can be achieved.

Figure 4:
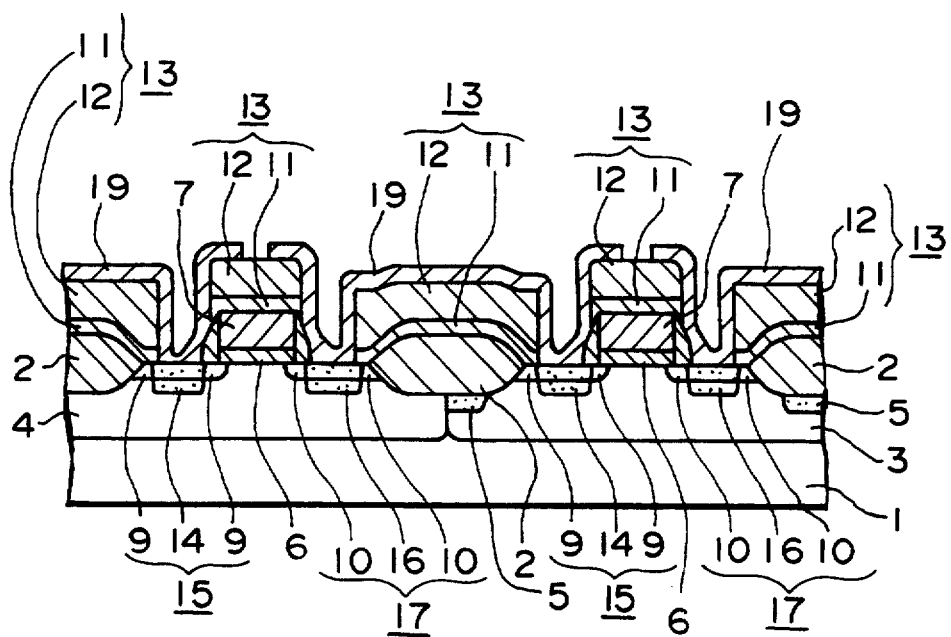
FIG. 4 is a partial sectional view showing a part of the manufacturing process of the semiconductor device in the first embodiment of the present invention.

In a process shown in FIG. 4, aluminum alloy is deposited by sputtering on surfaces of the semiconductor substrate 1, the interlayer dielectric film 13 and the side walls 8 of the gate section which are obtained in the process shown in FIG. 3. Following this, after performing a desired patterning, a wiring 19 is formed.

Figure 5:
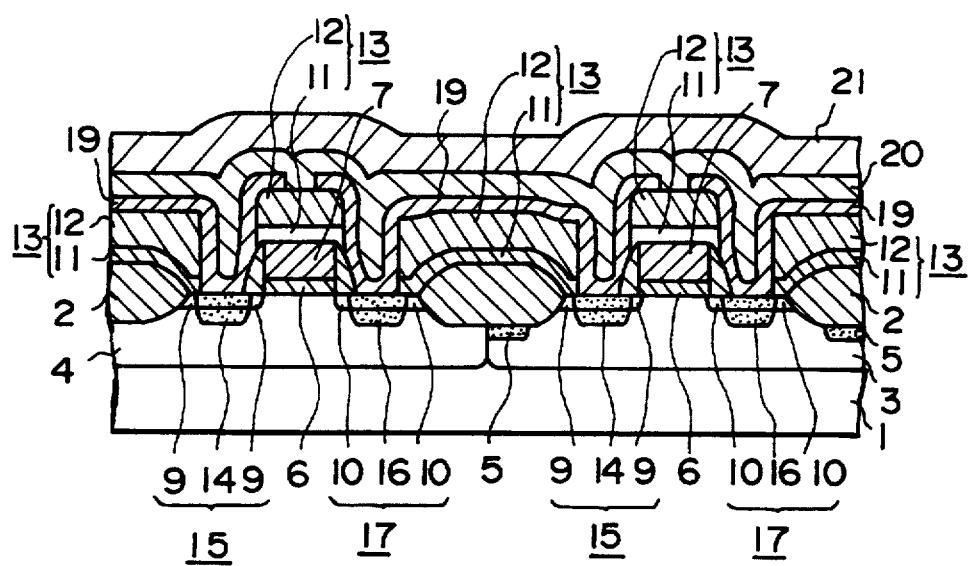
FIG. 5 is a partial sectional view showing a part of the manufacturing process of the semiconductor device in the first embodiment of the present invention.

Subsequently, in a process shown in FIG. 5, a plasma CVD oxide film 20 and a plasma CVD nitride film 21 are sequentially deposited on the wiring 19 and the interlayer dielectric film 13 obtained in the process shown in FIG. 4.

Thereafter, desired processes are performed to complete a semiconductor device.

Next, a second embodiment of the present invention will be described.

Figure 6:
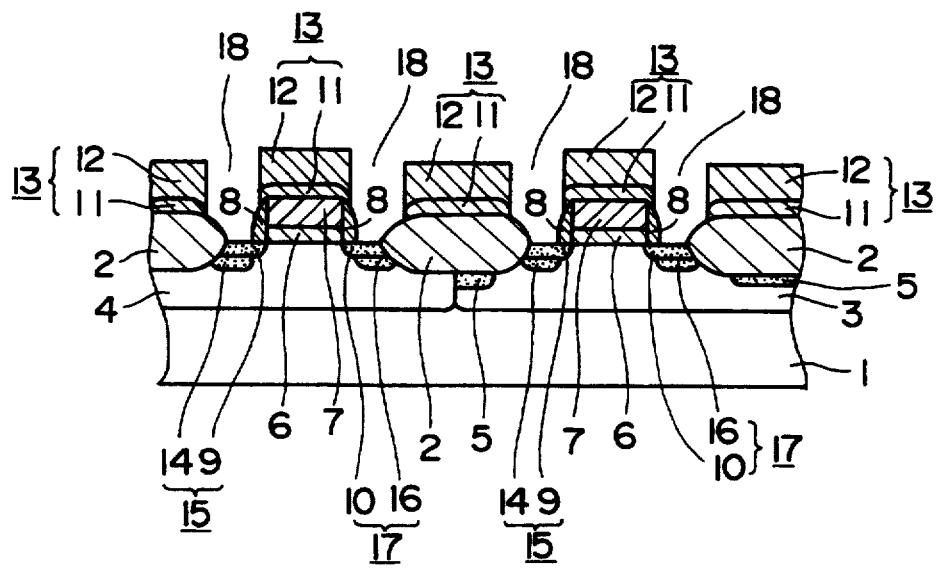
FIG. 6 is a partial sectional view showing a part of the manufacturing process of the semiconductor device in a second embodiment of the present invention.
Figure 7:
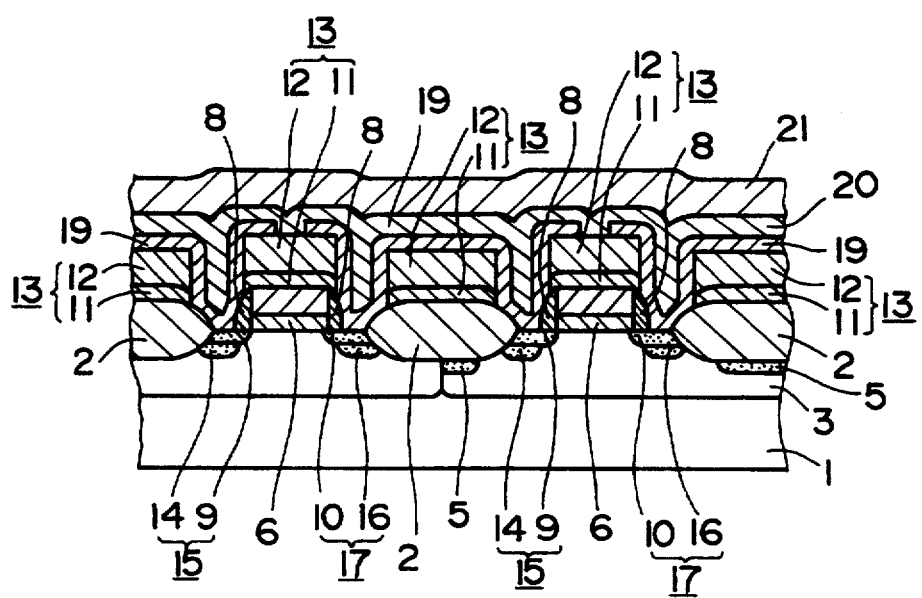
FIG. 7 is a partial sectional view showing a part of the manufacturing process of the semiconductor device in the second embodiment of the present invention.

FIGS. 6 and 7 are partial sectional views illustrating a part of manufacturing process of a semiconductor device in the second embodiment.

In a process shown in FIG. 6, after performing the same processes as shown in FIGS. 1 and 2, an interlayer dielectric film 13 is formed over the whole surface in a process similar to that in FIG. 3.

Subsequently, a photoresist film is coated on the interlayer dielectric film 13, and this photoresist film is patterned to form a mask for opening a contact hole 18 which is formed in a later process. At this time, the photoresist film is patterned so that a part of side walls of the contact hole 18 is constituted by the side walls 8 of the gate section and by the field oxide film 2 (so that a part of the contact hole 18 is defined by the side walls 8 and the field oxide film 2). Here, the photoresist film is formed so that a relatively steep portion of an upper part of a bird's beak of the field oxide film 2 consists of a part of the side walls of the contact hole 18.

Then, the interlayer dielectric film 13 is subject to an anisotropic etching by using the photoresist film after being patterned as a mask to open the contact hole 18. In this case, the side walls 8 are formed with a silicon nitride film having a very large etching resistivity with respect to the interlayer dielectric film 13, and the field oxide film 2 is formed by a thermal oxidization and the etching resistivity with respect to the interlayer dielectric film 13 is large. As a result, the side walls 8 of the gate section and the field oxide film 2 are hardly eroded in the anisotropic etching. Accordingly, at least a part of the side walls of the contact hole 18 can be constituted by the side walls 8 of the gate section and by the field oxide film 2. By doing this, the areas of the source 15 and the drain 17 are further reduced, and thus, junction capacitance at these portions can be reduced. Accordingly, a high speed operation of the device can be improved.

Subsequently, after forming the source 15 and the drain 17 by a method similar to that in FIG. 3, the processes following FIG. 4 are carried out, and as shown in FIG. 7, a semiconductor device is completed in which at least a part of the side walls of the contact hole 18 is constituted by the side walls 8 of the gate section and by the field oxide film 2.

In the first and second embodiments, while the polycrystal silicon film is used as a material for forming the gate electrode 7, the present invention is not limited to this, and a polycide film or a refractory metal film or the like may be used.

Furthermore, In the first and second embodiments, while the silicon nitride film is used as a material for forming the side walls 8 of the gate section, the present invention is not limited to this, and another material such as oxinitride, tuntalum oxide, polycrystalline silicon film, or the like may be used so long as a film for forming the side walls has a large etching resistivity with respect to the interlayer dielectric film 13 and the film is hardly eroded at the time of etching the interlayer dielectric film 13.

In the case of using the polycrystalline silicon film as the side wall forming material, in order to sufficiently maintain the insulation between the gate electrode 7 and the contact hole 18, it is preferable to form an oxide film on the surface of the gate electrode 7.

Furthermore, as the impurity which is implanted for forming the source 15 and the drain 17, a P-type impurity such as boron, gallium, or the like may be used in the P-type MOS transistor section, and an N-type impurity such as phosphorous, arsenic or the like may be used in the N-type MOS transistor section.

As a material for forming the wiring 19, aluminum alloy, aluminum polyfilm, impurity doped polycrystalline silicon film, titanium nitride film, or the like may be arbitrary selected.

Next, a third embodiment of the present invention will be described with reference to the drawings.

Figure 8:
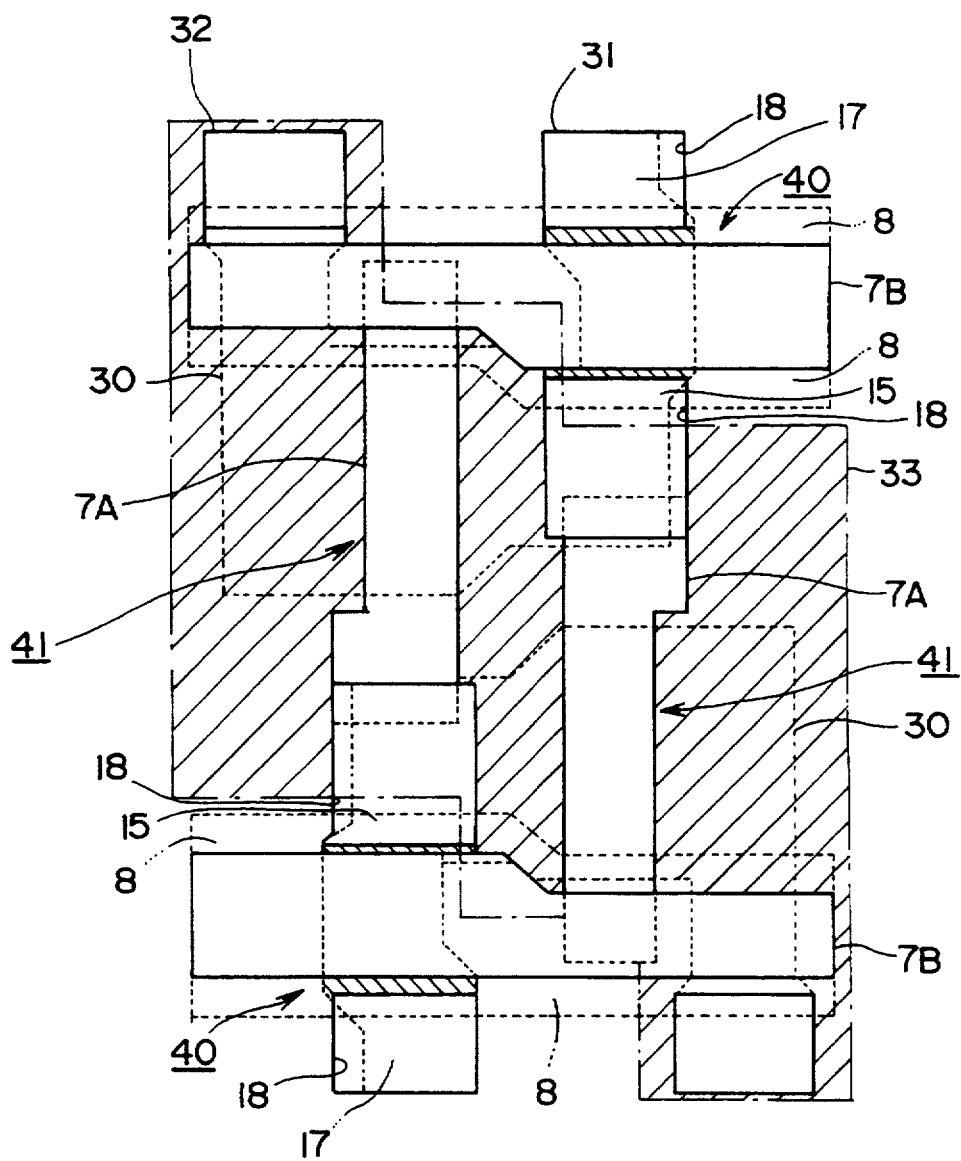
FIG. 8 is a partial plan view showing a part of the manufacturing process of the semiconductor device an a third embodiment of the present invention.

FIG. 8 is a plan view illustrating a part of a manufacturing process of a SRAM (Static Random Access Memory) which is a part (0.5 micrometer rule) of a semiconductor device of the third embodiment of the present invention.

In a process shown in FIG. 8, a gate electrode 7A and a source and a drain 33 constituting a driver transistor 41 are formed at a predetermined position on an active region 30, and following this, a gate electrode 7B constituting a transfer transistor 40 is formed. Subsequently, an impurity of relatively low concentration is ion implanted by using the gate electrode 7B as a mask. Then, after forming side walls 8 composed of silicon nitride films on side surfaces of the gate electrode 7B, an interlayer dielectric film is formed over the whole surface.

Subsequently, a photoresist pattern for opening a contact hole 18 is formed on the interlayer dielectric film, and etching is performed by using the photoresist pattern as a mask thereby to form the contact hole 18. At this time, the contact hole 18 is formed so that a part of side walls of the contact hole 18 is constituted by the side walls 8 of the gate electrode 7B. Here, since the side walls 8 have a large etching resistivity with respect to the interlayer dielectric film, the side walls 8 are hardly eroded in the etching for forming the contact hole 18, and thus, the contact hole 18 is formed in a self-aligned manner.

Since a part of side walls of the contact hole 18 is constituted by the side walls 8 of the gate electrode 7B, supposing that, for example, a width of each of the side walls 8 is 0.2 $\mu$m, in order to form the contact hole 18, it will be sufficient if a margin between the gate electrode 7B and the contact hole 18 on the mask is 0.05 to 0.1 $\mu$m or larger. On the other hand, when the contact hole is formed by a prior art method, the margin between the gate electrode 7B and the contact hole 18 on the mask is required to be more than 0.3 $\mu$m. It will be seen that the present invention is very effective in reducing the cell size of the SRAM cell.

The contact hole 18 serves as a region into which an impurity is implanted at the time of forming regions for a source 15 and a drain 17 in which the impurity concentration is relatively high. In other words, the contact hole 18 serves for both the connection of the source 15 and the drain 17 with wirings, and the aperture of the mask for forming the regions of relatively high impurity concentration. As a result, the manufacturing process is simplified.

Subsequently, the impurity of relatively high concentration is implanted by using the interlayer dielectric film having the contact hole 18 opened therein as a mask, to form the source 15 and the drain 17 of the LDD structure.

In FIG. 8, the reference numeral 31 designates a bit line leading section, and reference numeral 32 designates a ground leading section.

Thereafter, desired processes are performed to complete a semiconductor device.

In the third embodiment, the source and the drain of the driver transistor 41 may be of the LDD structure.

The present invention provides the following advantages.

In the first aspect of the invention, as described in the foregoing, at least a part of the side walls of the contact hole is constituted by the side walls of the gate section. As a result, the spacing between the gate electrode and the contact hole can be reduced, and at the same time, the areas of the source and the drain can be reduced. Thus, the device can be made fine, and at the same time, the junction capacitance between the source and the well and between the drain and the well can be reduced. A high speed operation of the device can be improved.

Furthermore, since the high concentration impurity layers of the source and the drain are formed by using the interlayer dielectric film having the contact holes opened therein and the side walls of the gate section as a mask, the high concentration impurity layers can be formed in a self-aligned manner. Also, the contact ion implantation for the purpose of reducing the contact resistance can be performed simultaneously. As a result, the manufacturing process can be made simple.

Furthermore, since the high concentration impurity layers are only subjected to a thermal treatment for activating the impurity layers which are performed in a later process, the diffusion of impurity can be made minimum, and the short channel effect can be suppressed. As a result, in addition of the suppression of the short channel effect, the device can be made fine and the high speed operation is improved.

In the second aspect of the invention, since at least a part of the side walls of the contact hole is constituted by the side walls of the gate section and by the field oxide film, in addition to the above-mentioned advantage, the areas of the source and the drain can be further reduced. Thus, the device is made further fine, and the junction capacitance between the source and the well and between the drain and the well can be reduced. A high speed operation of the device can be improved.

In the third aspect of the invention, since the semiconductor device is provided with the side walls of the gate section composed of the silicon nitride films having a large etching resistivity with respect to the interlayer dielectric film, and having a high dielectric constant, in addition to the above-mentioned advantage, the electric field at a drain end can be moderated. As a result, the generation of hot carriers is suppressed, and the hot carrier-resistant property can be improved.

In the fourth aspect of the invention, since the semiconductor device is provided with the side walls of the gate section composed of the polycrystalline films having a large etching resistivity with respect to the interlayer insulating film and having a high dielectric constant, in addition to the above-mentioned advantage, the breakdown voltage between the source and the drain can be improved.

In the fifth aspect of the invention, since in the manufacturing method of the semiconductor device, the side walls composed of films having a large etching resistivity with respect to the interlayer dielectric film are formed on the side surfaces of the gate electrode and the gate oxide film after the low concentration impurity layers are formed, and the contact hole is opened into the interlayer dielectric film formed over the whole surface so that at least a part of the side walls of the contact hole is constituted by the side walls of the gate section, the side walls of the gate section are hardly eroded at the time of opening the contact hole, and the spacing between the gate electrode and the contact hole can be reduced. As a result, the junction areas between the source and the well and between the drain and the well can be reduced, and the junction capacitance between the source and the well and between the drain and the well can be reduced.

Furthermore, since the metallic wiring layer connected to the source and the drain is formed extending to the end portion of the side walls of the gate section, the parasitic resistance of the source and the drain can be reduced. Thus, the high speed operation of the device can be achieved, and the non-uniformity of the characteristics of the device can be suppressed.

Furthermore, since the high concentration impurity layers are formed by ion implantation by using, as a mask, the interlayer dielectric film having the contact hole opened therein and by using the side walls of the gate section, the high concentration impurity layers can be formed in a self-aligned manner. As a result, regardless of the alignment accuracy of the lithographic apparatus, the spacing between the gate electrode and the contact hole can be reduced. Furthermore, since the contact ion implantation to reduce the contact resistance can be performed simultaneously with the formation of the contact hole, the manufacturing process can be made simple.

Furthermore, since the high concentration impurity layers are only subjected to the thermal treatment performed later to activate the impurity layers, the diffusion of the impurity can be suppressed to minimum, and the short channel effect can be suppressed.

In the sixth aspect of the invention, since in the manufacturing method of the semiconductor device, the contact hole is opened into the interlayer dielectric film so that at least a part of the side walls of the contact hole is constituted by the side walls of the gate section and constituted by the field oxide film, in addition to the above-mentioned advantage, the areas of the source and the drain can be reduced further.

In the seventh aspect of the invention, since in the manufacturing method of the semiconductor device, after the oxide film is formed on the surface of the gate electrode, the side walls composed of the polycrystalline silicon films are formed on the side surfaces of the oxide film. And thereafter, the contact hole is opened in the interlayer dielectric film formed over the whole surface so that at least a part of side wall of the contact hole is formed by the side walls of the gate section. Accordingly, the spacing between the gate electrode and the contact hole can be reduced. As a result, the areas of the source and the drain can be reduced while maintaining the insulation between the contact hole and the gate electrode. Thus, the junction capacitance between the source and the well and between the drain and the well can be reduced.

In the eighth aspect of the invention, in the manufacturing method of the semiconductor device, the contact hole is opened so that at least a part of the side walls of the contact hole is constituted by the side walls of the gate section and the field oxide film. Thus, in addition to the above-mentioned advantage, the areas of the source and the drain can be further reduced.

What is claimed is:

1. A semiconductor device comprising:
a gate electrode formed on a gate oxide film on a semiconductor substrate; a source and a drain, each of the source and the drain being composed of a low concentration impurity layer and a high concentration impurity layer; side walls formed on side surfaces of a gate section, the gate section including the gate electrode and the gate oxide film; an interlayer dielectric film formed directly on the gate electrode, the source, the drain, a field oxide, and the side walls; and contact holes opened into the interlayer dielectric film for respectively connecting wiring to the source and the drain, wherein the side walls are formed with films having a property in which an etching resistivity with respect to the interlayer dielectric film is large, and the side walls of the gate section constitute at least a part of side walls of each of the contact holes, and the high concentration impurity layer of each of the source and the drain are formed with respect to a corresponding one of the contact holes in a self-aligned manner.

2. A semiconductor device according to claim 1, wherein at least a part of the side walls of each of the contact holes is composed of a field oxide film.

3. A semiconductor device according to claim 1, wherein the side walls of the gate section are composed of a silicon nitride film.

4. A semiconductor device according to claim 1, wherein the side walls of the gate section are composed of polycrystalline silicon films.

* * * * *